(12) United States Patent
Kim

(10) Patent No.: US 6,549,023 B2
(45) Date of Patent: Apr. 15, 2003

(54) APPARATUS FOR MEASURING THE FOCUS OF A LIGHT EXPOSURE SYSTEM USED FOR FABRICATING A SEMICONDUCTOR DEVICE

(75) Inventor: Young-Chang Kim, Seoul (KR)

(73) Assignee: Samsung Electric Co., Ltd., Kyungki-do (KR)

(*) Notice: Subject to any disclaimer, the term of this patent is extended or adjusted under 35 U.S.C. 154(b) by 0 days.

(21) Appl. No.: 09/877,138

(22) Filed: Jun. 11, 2001

(65) Prior Publication Data
US 2002/0030496 A1 Mar. 14, 2002

(30) Foreign Application Priority Data
Jul. 27, 2000 (KR) ........................ 2000-43303

(51) Int. Cl.[7] .................. G01R 31/308; G01R 31/00
(52) U.S. Cl. ........................ 324/753; 324/96
(58) Field of Search ................... 324/753, 752, 324/765, 96, 244.1, 76.36, 501, 702, 175; 356/401, 621; 250/208.1, 548; 257/59

(56) References Cited

U.S. PATENT DOCUMENTS

| 6,088,113 A | * | 7/2000 | Kim ........................ 250/548 |
| 6,323,952 B1 | * | 11/2001 | Yomoto et al. ............. 356/512 |
| 6,407,800 B1 | * | 6/2002 | Shimokawa et al. ..... 250/201.3 |

* cited by examiner

Primary Examiner—Christine Oda
Assistant Examiner—James Kerveros
(74) Attorney, Agent, or Firm—Lee & Sterba, P.C.

(57) ABSTRACT

An apparatus for measuring the focus of a light exposure system for selectively exposing a photosensitive plate to light rays in a process of fabricating a semiconductor device, wherein there is provided a focus measuring part having opaque region, transparent region, and a transparent electrode arranged in the transparent region, a conducting stage supporting the photosensitive plate; and a capacitance detector for measuring the capacitance between the transparent electrode and the conducting stage.

8 Claims, 5 Drawing Sheets

APPARATUS FOR MEASURING THE FOCUS OF A LIGHT EXPOSURE SYSTEM USED FOR FABRICATING A SEMICONDUCTOR DEVICE

BACKGROUND OF THE INVENTION

1. Field of the Invention

The present invention relates to a light exposure system used for fabricating a semiconductor device. More particularly, the present invention relates to an apparatus for measuring the focus of the light exposure system.

2. Description of the Related Art

Measurement of the focus of a light exposure system is very important, because the amount of the defocusing critically affects the shape and size of the pattern formed on a photosensitive plate. As the operational method of the exposure system has been recently changed from the so-called "step and repeat" type to the "step and scan" type, the measurement and control of the focus require more highly advanced technology. The step and repeat type method exposes the photosensitive plate in static state after adjusting the focus where as, the step and scan type method must continue measuring and adjusting the focus because the photosensitive plate is moving while exposed.

The apparatus for measuring the focus of a light exposure system is basically an instrument for measuring a distance. The methods of measuring the focus in the exposure system are generally classified into two groups. One group is based on constructing an optical interference using a light source such as laser, and the other group is based on measuring the capacitance between the photosensitive plate and the electrode. The former method may correctly read only the light source exposed portion to measure the focus, and therefore, by selecting a number of measuring points, the surface state of the photosensitive plate may be correctly detected together with the tilt or leveling of an exposed region. However, in this case, the coverage of the measuring light source is very small compared to the exposed region and so allows only a localized measurement. Thus, an erroneous result may occur depending on the optical properties of the photosensitive plate with respect to the surface thin film. Hence, if the point measure of the focus accidentally does not belong to the representative group, the resultant pattern may be defocused.

Meanwhile, the latter method measuring the capacitance easily covers a large area to measure the focus, and therefore it is possible to correctly measure the average focus of the whole regions exposed. The step and scan type performs the exposure especially through a narrow slit adversely affecting the measurement of the tilt of the exposed region. However, it is advantageous in that the measurement is determined by the distance between the electrode and the photosensitive plate and is not affected significantly by the surface state of the photosensitive plate. The conventional apparatus for measuring such capacitance includes a grounded conductive stage, photosensitive plate closely contacting the upper surface of the stage, and focus measuring part having an exposing slit and opaque electrodes mounted around the slit and arranged over the stage.

Referring to FIG. 1, the conventional focus measuring part 10 is divided into the transparent and opaque regions. The transparent region is provided with a rectangular slit 11 while the opaque region is provided with first, second, third and fourth opaque electrodes 12, 13, 14 and 15. The opaque electrodes have been conventionally used to measure respective capacitances, of which the effective values within a predetermined range are used to obtain the measurement average.

However, the conventional apparatus for measuring the focus suffers the inherent structural problem that the opaque electrodes used for measuring the focus are separated from the transparent region, which tends to degrade the accuracy of measurement. Namely, the exposed region is displaced from the transparent region with reference to the photosensitive plate. Thus, if the surface of the photosensitive plate has a slight slope the measurement error will be insignificant, if however, the photosensitive plate is abruptly sloped the error will be significant. Such abrupt slope often occurs in the chip boundary of the photosensitive plate, so that the chip arranged in the edges of the photosensitive plate may suffer pattern imperfection.

SUMMARY OF THE INVENTION

It is a feature of an embodiment of the present invention to provide an apparatus for measuring the focus of a light exposure system to minimize the measurement error.

According to an aspect of the present invention, an apparatus for measuring the focus of a light exposure system used for selectively exposing a photosensitive plate to light rays in a process of fabricating a semiconductor device, comprises a focus measuring part having opaque region, transparent region, and a transparent electrode arranged in the transparent region, a stage supporting the photosensitive plate; and a capacitance detector for measuring the capacitance between the transparent electrode and the stage.

These and other features of the present invention will be readily apparent to those of ordinary skill in the art upon review of the detailed description that follows. The present invention will now be described more specifically with reference to the drawings attached only by way of example.

BRIEF DESCRIPTION OF THE ATTACHED DRAWINGS

DETAILED DESCRIPTION OF THE PREFERRED EMBODIMENT

Korean Patent Application No. 43304/2000, filed Jul. 27, 2000, and entitled, "Apparatus for Measuring the Focus of a Light Exposure System Used for Fabricating a Semiconductor Device," is incorporated by reference herein in its entirety.

Throughout this section detailed descriptions of the conventional parts that are not required to comprehend the technical concept of the present invention are omitted.

Figure 1:
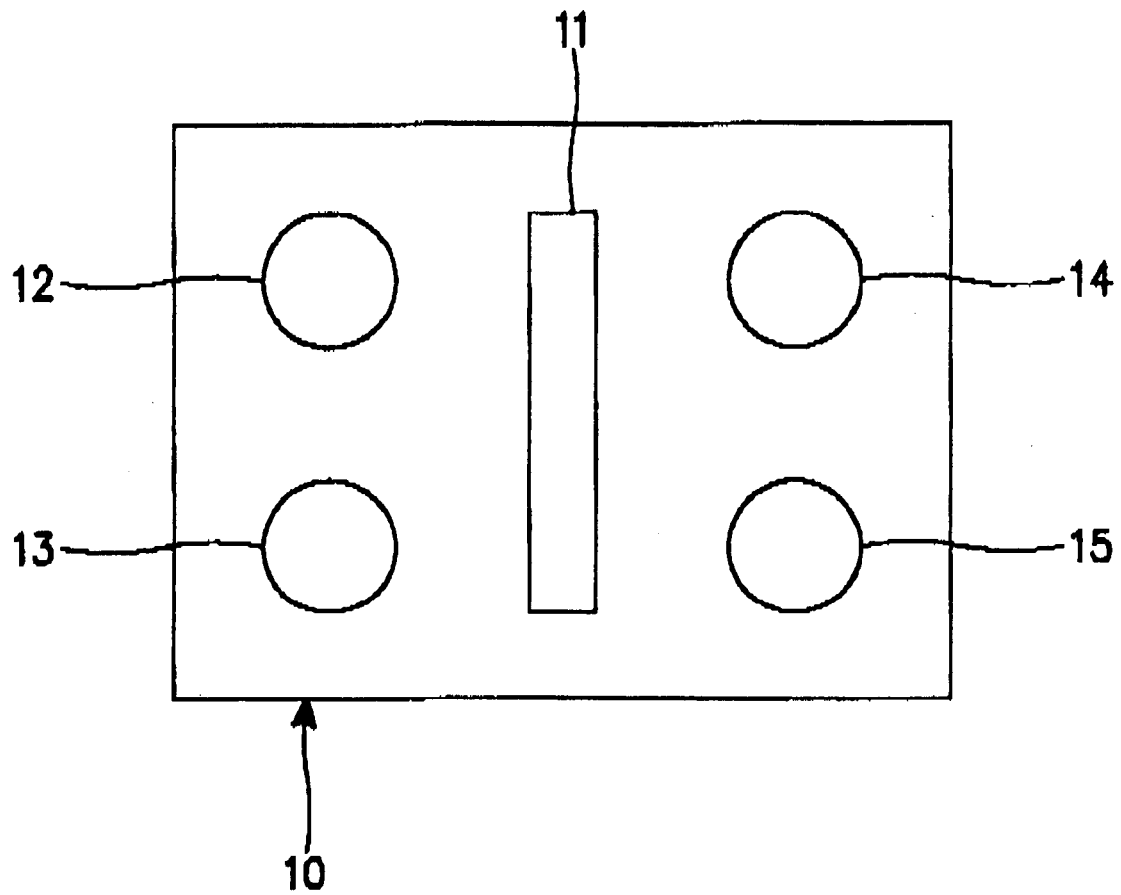
FIG. 1 illustrates a schematic top view of the conventional focus measuring part according to the prior art.
Figure 2A:
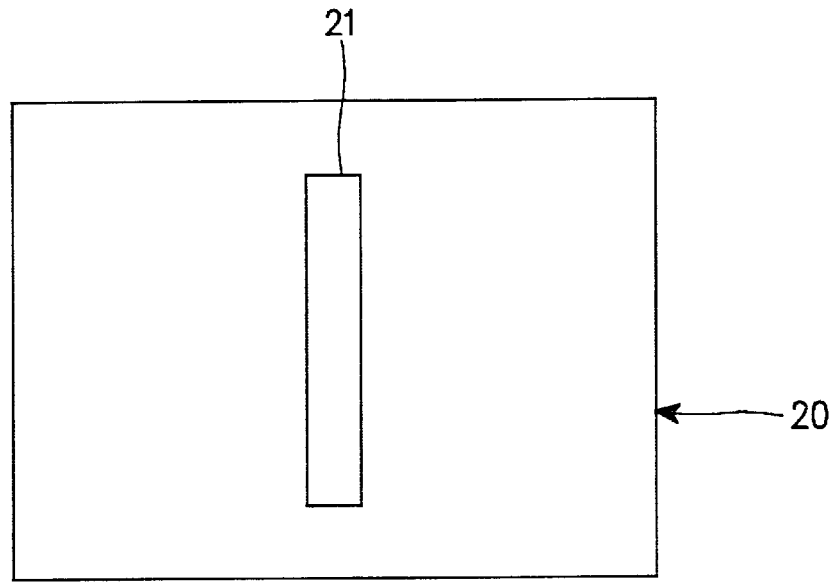
FIG. 2A illustrates a schematic top view of a focus measuring part according to a first embodiment of the present invention.

Referring to FIG. 2A, the focus measuring part 20 is provided with an exposure slit where a transparent electrode 21 is mounted. The transparent electrode 21 consists of a transparent plate coated with a transparent conductive layer, and a transparent protective layer for protecting said transparent conductive layer from external environment. The transparent conductive layer is a transparent metallic thin film that may be composed of a material such as ITO (Indium Tin Oxide) or ZnO (Zinc Oxide) characterized by low incidental optical loss in absorption, scattering, etc. The transparent substrate may be made of glass, on which the transparent conductive layer is deposited by vacuum deposition, sputtering, spin coating, etc. The transparent conductive layer serves as the electrode for measuring the capacitance, transmitting the light entering the slit to make the exposed region conform to the region used for measuring the focus in the photosensitive plate.

Figure 2B:
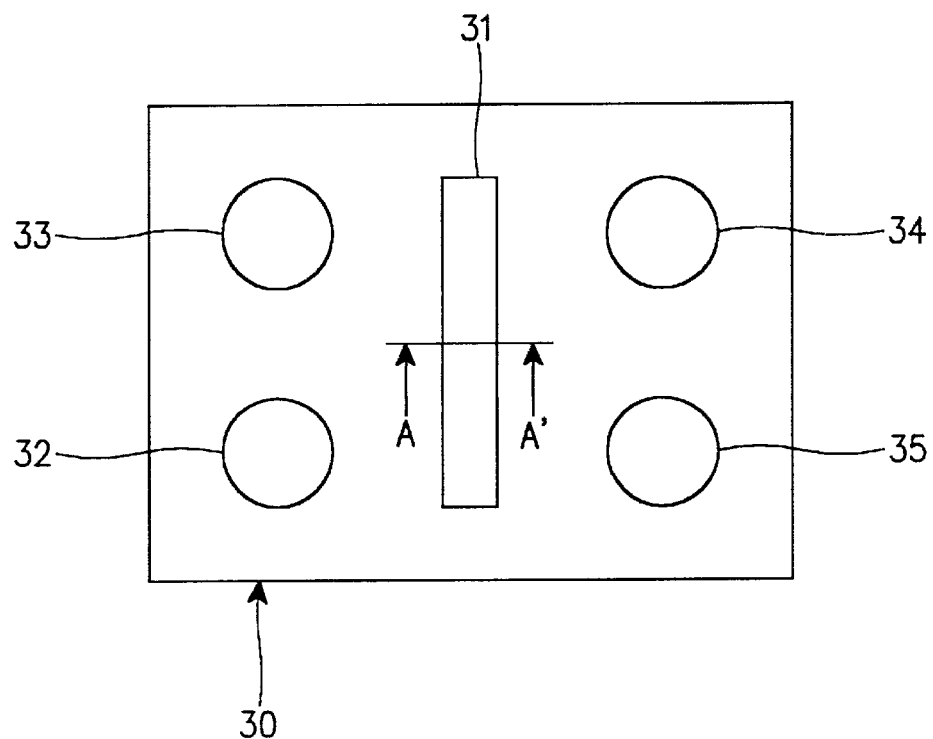
FIG. 2B illustrates a view similar to FIG. 1 but according to another preferred embodiment of the present invention.

In another embodiment as shown in FIG. 2B, the focus measuring part 30 includes a transparent electrode 31 mounted in the exposure slit, and first, second, third and fourth opaque electrodes 32, 33, 34 and 35 mounted around the transparent electrode 31. The transparent electrode 31 includes a transparent conductive layer serving both as an electrode and as a transmitter for the incident light. The additional first, second, third and fourth opaque electrodes 32, 33, 34 and 35 are to increase the size of the portion covered by an operation of measuring the focus, which has been the advantage enjoyed by the conventional apparatus in case of a photosensitive plate with the upper surface not seriously curved. Thus, a plurality of the portions is exposed to measure the focus values, making it easy to detect the amount of the tilt of upper surface of the photosensitive plate.

Figure 3:
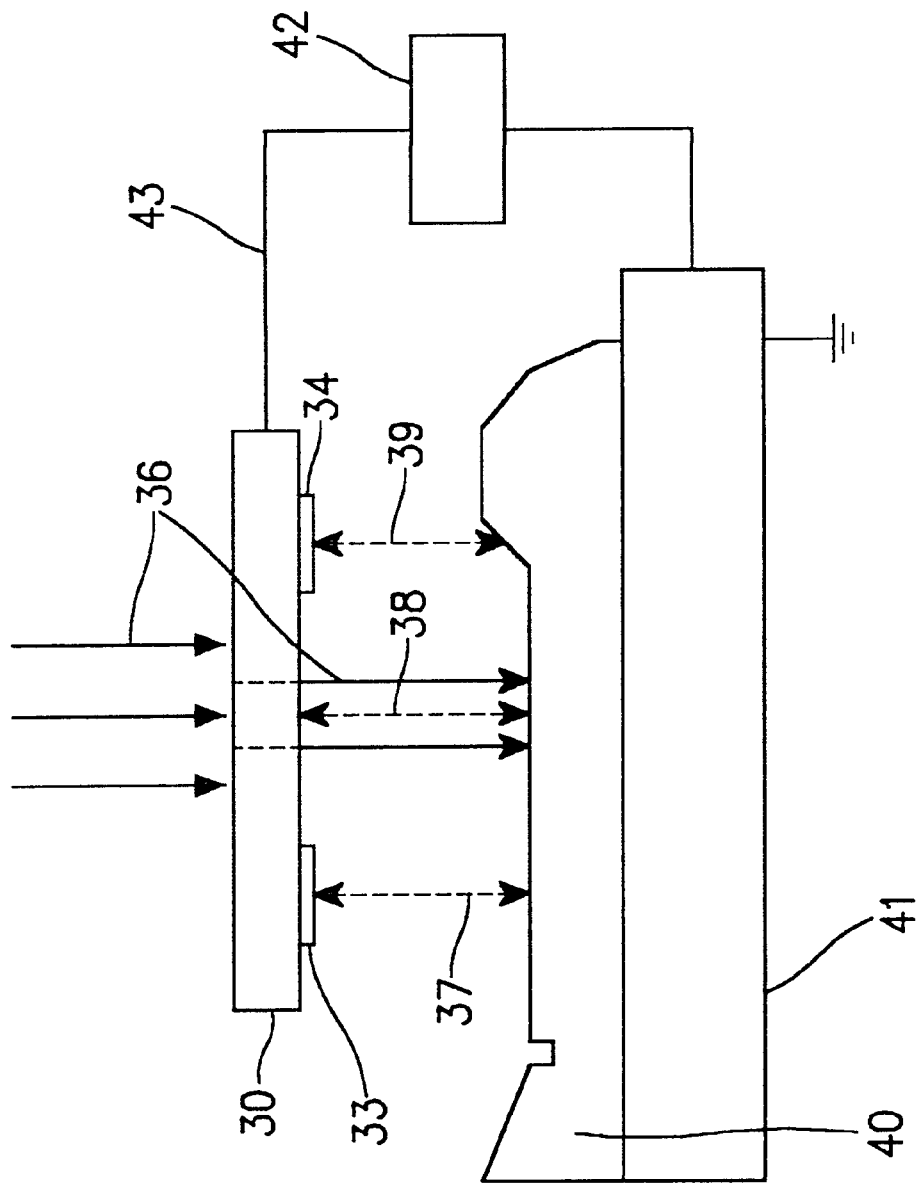
FIGS. 3 and 4 illustrate schematic diagrams of an apparatus for measuring the focus of the exposure system according to a preferred embodiment of the present invention.

Referring to FIG. 3, the incident light rays 36 on the focus measuring part 30 enter through the transparent conductive layer into the photosensitive plate 40 mounted on the grounded conductive stage 41. The focus measuring part 30, as shown in FIG. 2B, is provided with the first to fourth opaque electrodes 32, 33, 34 and 34, and the transparent electrode 31 mounted in the slit of the focus measuring part 30.

A capacitance detector 42 is electrically connected by a conductive line 43 with each of the electrodes 31, 32, 33 and 34 and 35 to measure the capacitance between the stage 41 and the electrodes. The values of the measured capacitance are converted into respective distances between the electrodes 31, 32, 33, 34 and 35 and the upper surface of the photosensitive plate 40, which are called the focus values. Referring to FIG. 3, there are shown the focus values $f_2$ 37, $f_3$ 39 and $f_5$ 38, respectively, measured from the second and third opaque electrodes 33 and 34 and the transparent electrode 31. In this case, the focus value $f_3$ 39 is measured on a slope of the photosensitive plate 40 generating an error.

Figure 4:
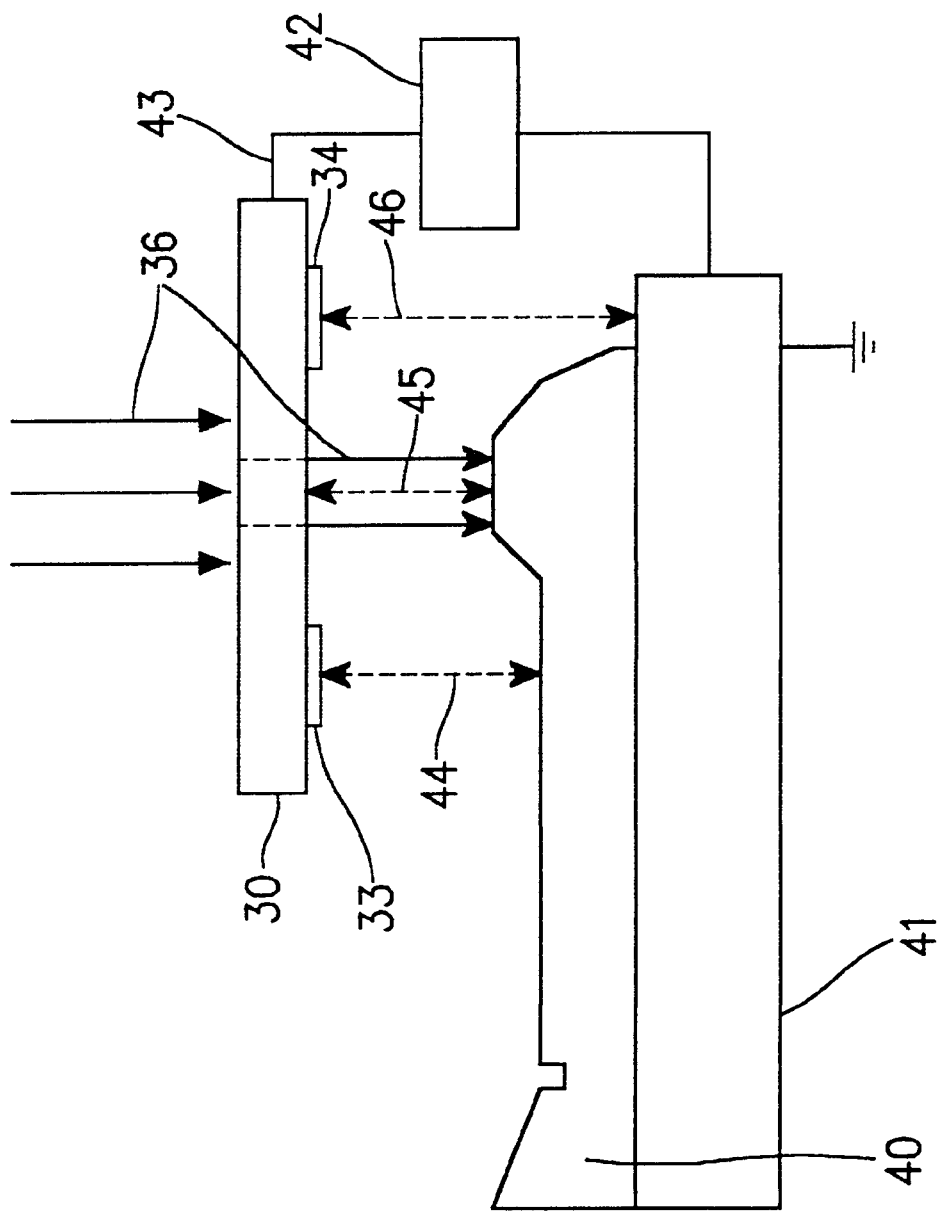

FIG. 4 shows the stage 41 displaced from the position of FIG. 3. In this case, the focus values $f_2$ 44, $f_3$ 46 and $f_5$ 45, respectively, measured from the second and third opaque electrodes ×and 34 and the transparent electrode 31 are different from one another. The focus values 44 and 46 measured from the second and third opaque electrodes 33 and 34 include serious errors because the exposed region does not correspond with the region measured on the photosensitive plate 40. The conclusive focus value is determined by substituting the focus values measured by all electrodes into the following Equation 1:

$$f = \frac{\left(\sum_{j=1}^{k} m_j \cdot f_j\right)}{k}, \quad \text{Equation 1}$$

if $f_j > f_{\lim}$ or $|f_j - f_{\text{slit}}| > f_{\lim, \text{mut}} \rightarrow m_j = 0$ Wherein f represents the conclusive focus value, $f_j$ the j'th focus value, k the number of the measured electrodes, $m_j$ the j'th weight value, $f_{lim}$ the limit focus value, $f_{slit}$ the focus value measured by the transparent electrode mounted in the slit, and $f_{lim,mut}$ the mutual limit focus value.

The weight value is properly determined according to the electrodes and the characteristics of the fabrication process. The limit focus value is intended to cancel abnormally large focus values by making their weight value zero. The abnormal focus value is generally caused by undesired particles existing in the photosensitive plate, or the edges of the photosensitive plate, etc. Preferably, the limit focus value is set to a value somewhat flexible, e.g., 5 μm, compared to the ordinary step value 1 μm of the photosensitive plate. If the number of the focus values exceeding the limit focus value is more than the mean value, it is desirable to generate an error signal because there may occur a pattern imperfection. In addition, if one of the focus values is significantly different from the others, the weight value is set to "0." For example, as illustrated in FIG. 3, the focus value $f_3$ 39 is measured from a slope region in the photosensitive plate 40, and therefore, considerably different from the focus values $f_2$ 37 and $f_5$ 38. In this case, the weight value $m_3$ multiplied by the focus value $f_3$ 39 substituted in Eq. 1 is set to "0." Alternatively, FIG. 4 illustrates a projected region on the photosensitive plate being measured by the transparent electrode 31. In this case, since the region measured by the transparent electrode 31 is the only exposed region to the light source, the focus value $f_5$ 45 is the only correct one. If the other focus values $f_2$ 44 and $f_3$ 46 are compared with the focus value $f_5$ 45 to show the differences exceeding the mutual limit focus value, the weight values $m_2$ and $m_3$ respectively multiplied by them are all set to "0." The mutual limit focus value is preferably about 1 μm. Unless the weight value is set to "0," it is desirable to set all the weight values to the same value, or otherwise to set only the weight value multiplied by the focus value measured by the transparent electrode to a value higher than the others.

Figure 5:
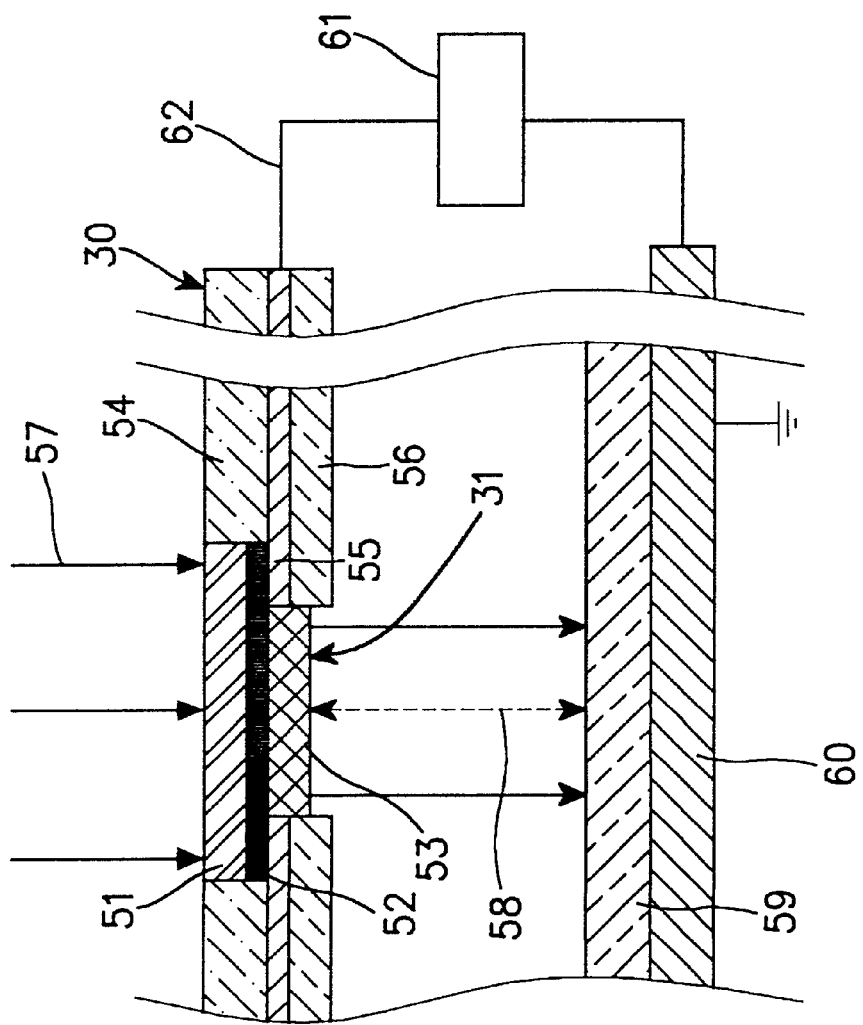
FIG. 5 illustrates in detail an enlarged cross-sectional view of the slit portion of the focus measuring part along A—A' in FIG. 2B.

Referring to FIG. 5 for illustrating an enlarged cross sectional area taken along line A—A' of the focus measuring part 30 as shown in FIG. 2B, the focus measuring part 30 is divided into the transparent region and the opaque regions. The transparent region consists only of the slit. The opaque region consists of first opaque layer 56, opaque conductive layer 55, and second opaque layer 54. The width of the first slit part formed in the first opaque layer 56 and opaque conductive layer 55 is smaller than the second slit part formed in the second opaque layer 54. The transparent electrode 31, consisting of a transparent plate 51 coated with a transparent conductive layer 52, and a protective layer 53, is arranged in the transparent region. The protective layer may be a hard coating applied to the transparent conductive layer, or a glass plate mounted in the first slit part. In the latter case, the transparent plate 51 coated with the transparent conductive layer 52 may be detached from the focus measuring part 30. The transparent conductive layer 52 is electrically connected to the opaque conductive layer 55.

If the protective layer 53 is the hard coating, the width of the transparent plate 51 is preferably equal to or smaller than that of the second slit part. In addition, the width of the protective layer 53 is equal to that of the first slit part. In this case, the width of the transparent plate 51 should be greater than that of the protective layer 53. In order to electrically connect the transparent conductive layer 52 and the opaque conductive layer 55, the transparent plate 51 coated with the transparent conductive layer is mounted on the edges of the first slit part, so that the lower edges of the transparent conductive layer 52 contact the upper edges of the opaque conductive layer 55. Then, the transparent electrode 31 may be freely detached from the focus measuring part 30 to be easily replaced or maintained. Alternatively, the transparent plate 51 may be permanently mounted in the second slit part, or designed to make it an integral part of the construction of the focus measuring part by performing photolithography, deposition process, etc. In the latter case, the first opaque layer and protective layer may be provided as the first layer, the opaque conductive layer and transparent conductive layer as the second layer, and the transparent plate and second opaque layer as the third layer. In this case, the second opaque layer may be completely eliminated to construct the third layer entirely by a single transparent plate, thus further simplifying the structure.

Preferably, the opaque conductive layer 55 shown in FIG. 5 may be in the form of the conventional conductive lines connected at the ends with the transparent conductive layer 52. The light rays 57 are transmitted through the transparent plate 51 to the protective layer to the photosensitive plate 59. The lower surface of the photosensitive plate 59 closely contacts the upper surface of the grounded stage 60. The capacitance detector 61 detects the capacitance between the transparent conductive layer 52 and stage 60. The capacitance detector 61 is connected to the transparent conductive layer 52 and stage 60 using conductive lines 62. The detected capacitance is used to calculate the focus value 58. The protective layer 53 serves to prevent the transparent conductive layer 52 from being contaminated and damaged. Because the transparent conductive layer 52 may be easily contaminated by materials evaporated from the photoresist during exposure process, it is preferable to detachably attach the transparent electrode 31 or transparent plate 51 for easy replacement or maintenance.

Thus, the inventive apparatus for measuring the focus of a light exposure system includes a transparent electrode mounted in the slit of the focus measuring part to make the measurement on the portion of the photosensitive plate exposed to light agrees with the measurement on the portion not exposed to light, providing a correct measurement. While the present invention has been described in connection with specific embodiments accompanied by the attached drawings, it will be readily apparent to those skilled in the art that various changes and modifications may be made thereto without departing the spirit and scope of the present invention.

What is claimed is:

1. An apparatus for measuring the focus of a light exposure system for selectively exposing a photosensitive plate to light rays in a process of fabricating a semiconductor device, comprising:
   a focus measuring part having opaque region, transparent region, and a transparent electrode arranged in said transparent region;
   a stage supporting said photosensitive plate; and
   a capacitance detector for measuring the capacitance between said transparent electrode and said stage.

2. The apparatus as defined in claim 1, wherein said transparent electrode consists of a transparent plate coated with a transparent conductive layer, and a protective layer for covering said transparent conductive layer.

3. The apparatus as defined in claim 1, wherein said transparent electrode is detachably attached to said focus measuring part.

4. The apparatus as defined in claim 1, wherein an opaque conductive layer is arranged in said opaque region of said focus measuring part to electrically connect said transparent electrode and said capacitance detector.

5. The apparatus as defined in claim 4, wherein said opaque region of said focus measuring part is provided with one or more opaque electrodes electrically connected by said opaque conductive layer to said capacitance detector.

6. The apparatus as defined in claim 5, wherein the number of opaque electrodes is four.

7. The apparatus as defined in claim 1, wherein said stage is a moveable conductive stage moving as the position exposed to light rays is changed.

8. The apparatus as defined in claim 2, wherein said transparent conductive layer is made of an indium tin oxide or a zinc oxide thin film.

* * * * *

UNITED STATES PATENT AND TRADEMARK OFFICE
CERTIFICATE OF CORRECTION

PATENT NO. : 6,549,023 B2
DATED : April 15, 2003
INVENTOR(S) : Young-Chang Kim

It is certified that error appears in the above-identified patent and that said Letters Patent is hereby corrected as shown below:

Title page,
Item [30], Foreign Application Priority Data, should read:
-- [30] Foreign Application Priority Data
Jul. 27, 2000 (KR) ...........2000-43304 --

Signed and Sealed this

Twenty-eighth Day of December, 2004

JON W. DUDAS
*Director of the United States Patent and Trademark Office*